(12) United States Patent
Trimberger

(10) Patent No.: US 7,251,804 B1
(45) Date of Patent: Jul. 31, 2007

(54) STRUCTURES AND METHODS OF OVERCOMING LOCALIZED DEFECTS IN PROGRAMMABLE INTEGRATED CIRCUITS BY ROUTING DURING THE PROGRAMMING THEREOF

(75) Inventor: Stephen M. Trimberger, San Jose, CA (US)

(73) Assignee: Xilinx, Inc., San Jose, CA (US)

( * ) Notice: Subject to any disclaimer, the term of this patent is extended or adjusted under 35 U.S.C. 154(b) by 335 days.

(21) Appl. No.: 10/956,556

(22) Filed: Oct. 1, 2004

(51) Int. Cl.
*G06F 17/50* (2006.01)

(52) U.S. Cl. .......................................... 716/16; 716/17

(58) Field of Classification Search .................... 716/1, 716/4–5, 16–17; 702/117, 120; 703/21, 703/23, 25; 714/25, 36, 724; 326/37–39
See application file for complete search history.

(56) References Cited

U.S. PATENT DOCUMENTS

| | | | |
|---|---|---|---|
| 4,899,067 A | 2/1990 | So et al. | |
| 5,153,880 A | 10/1992 | Owen et al. | |
| 5,255,227 A | 10/1993 | Haeffele | |
| 5,349,248 A | 9/1994 | Goetting et al. | |
| 5,430,734 A * | 7/1995 | Gilson ........................ | 714/725 |
| 5,434,514 A | 7/1995 | Cliff et al. | |
| 5,459,342 A | 10/1995 | Nogami et al. | |
| 5,485,102 A | 1/1996 | Cliff et al. | |
| 5,498,975 A | 3/1996 | Cliff et al. | |
| 5,513,144 A | 4/1996 | O'Toole | |
| 5,592,102 A | 1/1997 | Lane et al. | |
| 5,742,556 A | 4/1998 | Tavrow et al. | |
| 5,761,483 A | 6/1998 | Trimberger | |
| 5,764,577 A | 6/1998 | Johnston et al. | |
| 5,777,887 A | 7/1998 | Marple et al. | |
| 5,796,750 A | 8/1998 | Lottridge et al. | |
| 5,925,920 A | 7/1999 | MacArthur et al. | |
| 6,003,150 A | 12/1999 | Stroud et al. | |
| 6,107,821 A | 8/2000 | Kelem et al. | |
| 6,166,559 A | 12/2000 | McClintock et al. | |
| 6,167,558 A | 12/2000 | Trimberger | |
| 6,201,404 B1 | 3/2001 | Reddy et al. | |
| 6,202,182 B1 | 3/2001 | Abramovici et al. | |

(Continued)

OTHER PUBLICATIONS

U.S. Appl. No. 10/085,305, filed Feb. 28, 2002, Trimberger.

(Continued)

*Primary Examiner*—Vuthe Siek
(74) *Attorney, Agent, or Firm*—Lois D. Cartier

(57) ABSTRACT

Methods of programming an integrated circuit (IC) such as a programmable logic device to avoid localized defects present in the IC, and ICs capable of performing these methods. As part of an automated programming process, programmable resources utilized by a user design are tested, and the implemented user design is modified to avoid any defective programmable resources that are detected. The modifications can include, for example, rerouting one or more internal signals and/or substituting a fully functional programmable resource for a defective programmable resource. These methods are carried out by testing and implementation logic included in the IC. Design information such as a software device model, test program, test data, place and route program, and/or resource swapping program can be optionally included in the configuration logic or supplied in an expanded bitstream applied to the inventive IC. In some embodiments, the modified bitstream is written to an external memory device.

54 Claims, 5 Drawing Sheets

U.S. PATENT DOCUMENTS

| | | |
|---|---|---|
| 6,289,292 B1 | 9/2001 | Charlton et al. |
| 6,292,925 B1 | 9/2001 | Dellinger et al. |
| 6,311,316 B1 | 10/2001 | Huggins et al. |
| 6,344,755 B1 | 2/2002 | Reddy et al. |
| 6,496,971 B1 | 12/2002 | Lesea et al. |
| 6,530,071 B1 * | 3/2003 | Guccione et al. .............. 716/17 |
| 6,560,740 B1 | 5/2003 | Zuraski, Jr. et al. |
| 6,618,686 B2 | 9/2003 | Allamsetty |
| 6,664,808 B2 | 12/2003 | Ling et al. |
| 6,681,353 B1 | 1/2004 | Barrow |
| 6,725,442 B1 * | 4/2004 | Cote et al. .................... 716/16 |
| 6,915,503 B1 * | 7/2005 | Lesea .......................... 716/16 |
| 6,918,027 B2 | 7/2005 | Mantey et al. |
| 6,925,407 B2 | 8/2005 | Duppong |
| 7,007,250 B1 * | 2/2006 | Bapat et al. ................... 716/4 |
| 7,071,679 B1 | 7/2006 | Sabih et al. |
| 7,080,300 B1 | 7/2006 | Herron et al. |
| 7,146,598 B2 | 12/2006 | Horanzy |
| 7,185,293 B1 | 2/2007 | Ofer |
| 2001/0037458 A1 | 11/2001 | Kean |
| 2003/0097551 A1 | 5/2003 | Fuller et al. |
| 2003/0212940 A1 | 11/2003 | Wong |
| 2003/0225955 A1 | 12/2003 | Feldstein et al. |
| 2004/0010739 A1 | 1/2004 | Odom et al. |
| 2004/0193979 A1 | 9/2004 | Avery et al. |
| 2004/0193980 A1 | 9/2004 | Avery et al. |
| 2005/0125512 A1 | 6/2005 | Fuller et al. |
| 2005/0177251 A1 | 8/2005 | Duppong |
| 2005/0245098 A1 | 11/2005 | Cooney et al. |
| 2006/0253266 A1 | 11/2006 | Ong |
| 2006/0259871 A1 | 11/2006 | Washington et al. |

OTHER PUBLICATIONS

U.S. Appl. No. 10/104,324, filed Mar. 22, 2002, Wells et al.
U.S. Appl. No. 10/714,380, filed Oct. 31, 2003, Trimberger.
U.S. Appl. No. 10/717,040, filed Nov. 18, 2003, Ngai et al.
U.S. Appl. No. 10/813,414, filed Mar. 26, 2004, Stassart et al.
John Emmert et al.: "Dynamic Fault Tolerance in FPGAs via Partial Reconfiguration"; Annual IEEE Symposium on Field-Programmable Custom Computing Machines; Apr. 17, 2000; pp. 165-174.
John M. Emmert et al.; "Incremental Routing in FPGAs"; ASIC Confernece 1998. Proceedings, Eleventh Annual IEEE International; Rochester, NY; Sep. 13-16, 1998; pp. 217-221.
Xilinx, Inc.; "Virtex-II Pro Platform FPGA Handbook"; published Dec. 6, 2000; available from Xilinx, Inc., 2100 Logic Drive, San Jose, California 95124; pp. 33-75.
W. Bruce Culbertson et al.; "Defect Tolerance on the Teramac Custom Computer"; The 5th Annual IEEE Symposium on Field-Programmable Custom Computing Machines; Apr. 16-18, 1997; pp. 116-123.
Fran Hanchek et al.; "Node-Covering Based Defect and Fault Tolerance Methods for Increased Yield in FPGAs"; The Proceedings of the Ninth International Conference on VLSI Design; Jan. 1996; pp. 1-4.
Altera; Altera Data Sheet, vol. 1, Chapter 3 "Configuration and Testing"; and vol. 2 Chapter 8 "Remote System Upgrades with Stratix II Devices"; Feb. 2004; downloaded on Jun. 17, 2004 freom http://www.altera.com/literature/lit-stx2.
U.S. Appl. No. 10/956,986, filed Oct. 1, 2004, Trimberger.
U.S. Appl. No. 10/956,990, filed Oct. 1, 2004, Trimberger.
U.S. Appl. No. 10/957,261, filed Oct. 1, 2004, Trimberger.

* cited by examiner

STRUCTURES AND METHODS OF OVERCOMING LOCALIZED DEFECTS IN PROGRAMMABLE INTEGRATED CIRCUITS BY ROUTING DURING THE PROGRAMMING THEREOF

FIELD OF THE INVENTION

The invention relates to programmable integrated circuits (ICs). More particularly, the invention relates to methods and structures that route internal signals in a user design during the programming process to avoid localized defects in the programmable IC.

BACKGROUND OF THE INVENTION

Programmable logic devices (PLDs) are a well-known type of integrated circuit that can be programmed to perform specified logic functions. One type of PLD, the field programmable gate array (FPGA), typically includes an array of programmable tiles. These programmable tiles can include, for example, input/output blocks (IOBs), configurable logic blocks (CLBs), dedicated random access memory blocks (BRAM), multipliers, digital signal processing blocks (DSPs), processors, clock managers, delay lock loops (DLLs), and so forth.

Each programmable tile typically includes both programmable interconnect and programmable logic. The programmable interconnect typically includes a large number of interconnect lines of varying lengths interconnected by programmable interconnect points (PIPs). The programmable logic implements the logic of a user design using programmable elements that can include, for example, function generators, registers, arithmetic logic, and so forth.

The programmable interconnect and programmable logic are typically programmed by loading a stream of configuration data (a configuration bitstream) into internal configuration memory cells that define how the programmable elements are configured. The configuration data can be read from memory (e.g., from an external PROM) or written into the FPGA by an external device. The collective states of the individual memory cells then determine the function of the FPGA.

FPGAs are called "field programmable" because the configuration data is written to the device each time the device is powered up (i.e., the device is programmed in the field). Other field programmable PLDs include Complex Programmable Logic Devices (CPLDs), for example, to which configuration data can be written once and the device remains configured until the configuration data is erased or overwritten. Thus, a CPLD can be programmed by the CPLD provider, the customer, or both. Other field programmable PLDs can include, but are not limited to, anti-fuse and fuse devices. Some PLDs are only partially programmable. For example, one type of PLD includes a combination of hard-coded transistor logic and a programmable switch fabric that programmably interconnects the hard-coded transistor logic.

FIG. 1 is a simplified illustration of an exemplary FPGA. The FPGA of FIG. 1 includes an array of configurable logic blocks (LBs 101a-101i) and programmable input/output blocks (I/Os 102a-102d). The LBs and I/O blocks are interconnected by a programmable interconnect structure that includes a large number of interconnect lines 103 interconnected by programmable interconnect points (PIPs 104, shown as small circles in FIG. 1). PIPs are often coupled into groups (e.g., group 105) that implement multiplexer circuits selecting one of several interconnect lines to provide a signal to a destination interconnect line or logic block. As noted above, some FPGAs also include additional logic blocks with special purposes (not shown), e.g., DLLs, block RAM, and so forth.

As with any other integrated circuit, a field programmable PLD can include manufacturing defects. A defect too small to see can render a PLD completely or partially nonfunctional. PLD technology trends include rapidly increasing logic density. Thus, PLDs are manufactured using a very small feature size, and a tiny defect is more and more likely to impinge on active logic on the silicon surface of a die. Another important trend is a rapid increase in die size. As PLDs increase in size, the likelihood of a given die including a defect increases dramatically.

If a PLD die contains a single defective resource (e.g., if one of the configuration memory cells in an FPGA is defective), the PLD can render a user's end product unusable, because the user design might need to use that defective resource. To avoid causing problems for end users, a PLD provider generally discards a PLD if it contains even one defect that affects the active logic. Thus, a natural consequence of the increases in PLD size and density is an increase in the percentage of defective die, or a decrease in product yield.

The problem of low yield has significant economic impact on PLD providers. There are two types of defects: gross defects (which cause the failure of an entire PLD) and localized defects (which cause the failure of small portions of the PLD circuitry). It is common to discard large numbers of PLD dice that include only localized defects. Therefore, it is desirable to provide methods for using PLDs having localized defects ("partially defective PLDs") to implement user designs.

One known method for using partially defective PLDs is to sort out those PLDs that are defective only in an isolated function. For example, an FPGA provider can set aside all of those FPGAs in which only the block RAM is defective. If a user design does not use the block RAM, the design will still function correctly when implemented in one of these FPGAs. The FPGA provider can sell these partially defective devices to the customer at a reduced price, as an alternative to discarding them.

However, in FPGAs, for example, many defects occur in the large CLB arrays that can occupy the majority of the die. Each CLB includes both programmable logic (e.g., a configurable logic element, or CLE) and the associated programmable interconnect. The CLBs are largely identical to each other. Each CLE can be programmed to perform any of a very large number of functions, and each programmable interconnect line can be used to transport virtually any signal in a user design. Therefore, it is very difficult if not impossible to look at a user design and say with confidence that the implementation software will not use a given programmable resource to implement the design.

Further, when the design is implemented, the location of the defective programmable resource is generally unknown, and is different for each partially defective PLD. Hence, when a single user design is targeted to a large number of partially defective PLDs (e.g., when a user wants to use partially defective PLDs in production to reduce the selling price of the end product), it can be difficult to ensure that the implemented design will not impinge on defective locations in any of the partially defective PLDs.

Therefore, it is desirable to provide additional methods enabling the utilization of partially defective PLDs.

SUMMARY OF THE INVENTION

The invention provides methods of programming an integrated circuit (IC) such as a programmable logic device (PLD) to avoid localized defects present in the IC. As part of an automated programming process, programmable resources utilized by a user design are tested, and the implemented user design is modified to avoid any defective programmable resources that are detected. The modifications made to the implemented user design can include, for example, the rerouting of one or more internal signals to avoid a defective programmable resource, or substituting a fully functional programmable resource for the defective programmable resource. The invention also provides ICs capable of performing these methods.

The methods of the invention are carried out by novel configuration logic included in the IC (e.g., a partially defective PLD) that includes testing and implementation logic for the IC. The testing and implementation logic can be, for example, an on-chip microprocessor. The following are exemplary elements that can be included in the testing and implementation logic: a software device model for the IC, a test program for testing at least some of the programmable resources in the IC, test data expected from a fully functional IC when the test program is applied, a place and route program for the IC, and/or a resource swapping program for the IC. These elements, for example, can be stored in a non-volatile memory, programmed into the programmable resources of the IC during a previous programming step (e.g., a partial configuration step that programs only the testing and implementation logic into the IC), or coded as transistor logic on the IC die.

The process begins by reading an expanded bitstream into the IC. In some embodiments, the expanded bitstream includes a previously compiled bitstream for the user design. In some embodiments, the expanded bitstream includes design specifications for the user design, e.g., a logic description and/or timing requirements. In some embodiments, the expanded bitstream includes a software device model for the IC, a test program for testing at least some of the programmable resources in the IC, test data expected from a fully functional IC, a place and route program for the IC, and/or a resource swapping program for the IC.

The user design is then implemented in the IC (e.g., if a previously compiled bitstream was not already provided in the expanded bitstream), and the programmable resources used by the implemented user design are tested for defects that cause errors in the user design. When a defective programmable resource is identified, the implemented user design (e.g., the compiled bitstream within the programmed IC) is modified to avoid the defective programmable resource. In some embodiments, the modified bitstream is written to an external memory device. Future programming operations can be performed from the external memory device using standard programming methods.

BRIEF DESCRIPTION OF THE DRAWINGS

The present invention is illustrated by way of example, and not by way of limitation, in the following figures.

DETAILED DESCRIPTION OF THE DRAWINGS

The present invention is applicable to a variety of integrated circuits (ICs). The present invention has been found to be particularly applicable and beneficial for programmable logic devices (PLDs). An appreciation of the present invention is presented by way of specific examples utilizing PLDs such as field programmable gate arrays (FPGAs). However, the present invention is not limited by these examples, and can be applied to virtually any IC that includes programmable resources.

Figure 1:
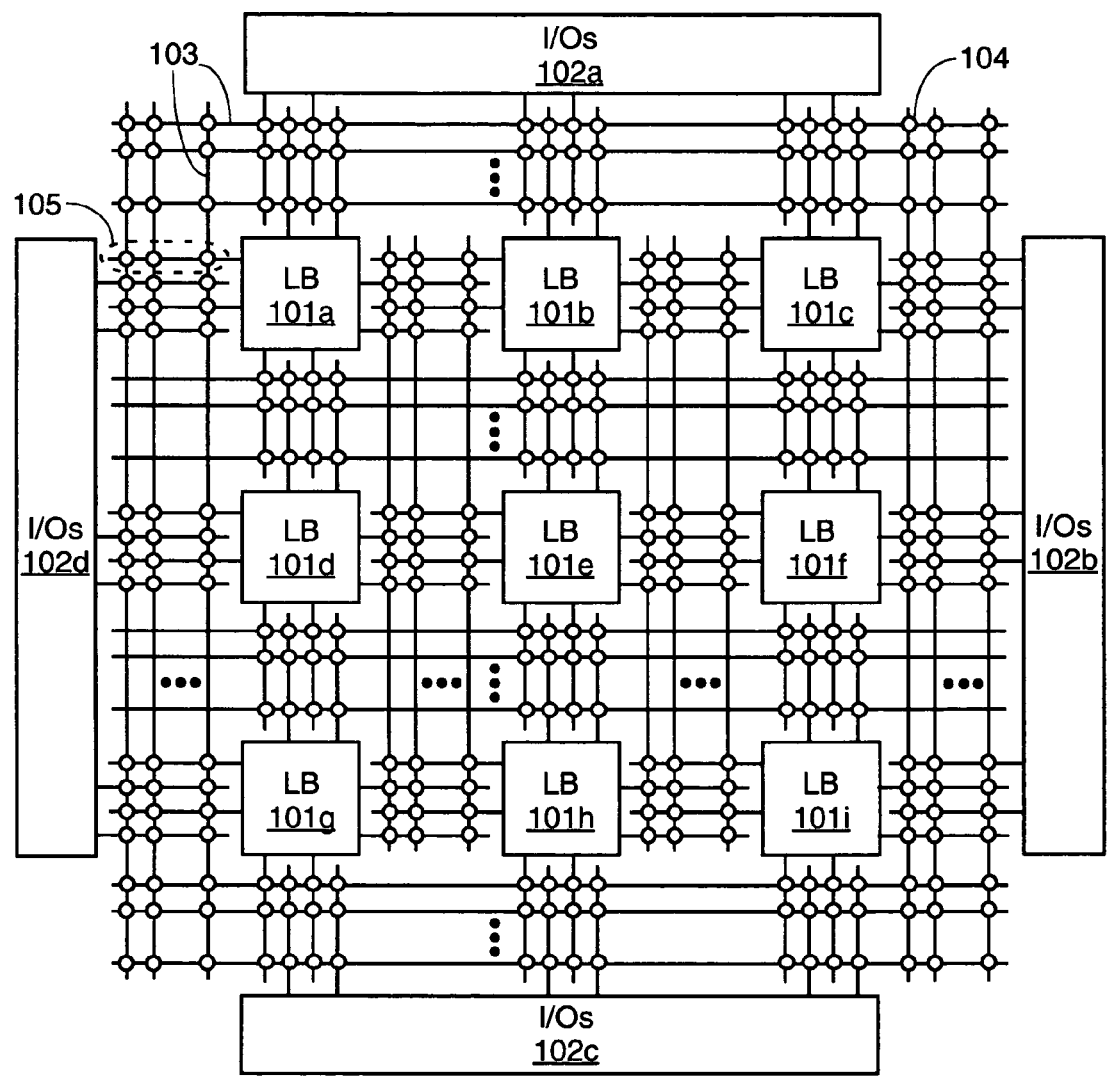
FIG. 1 is a simplified diagram of a well known Field Programmable Gate Array (FPGA) architecture.
Figure 2:
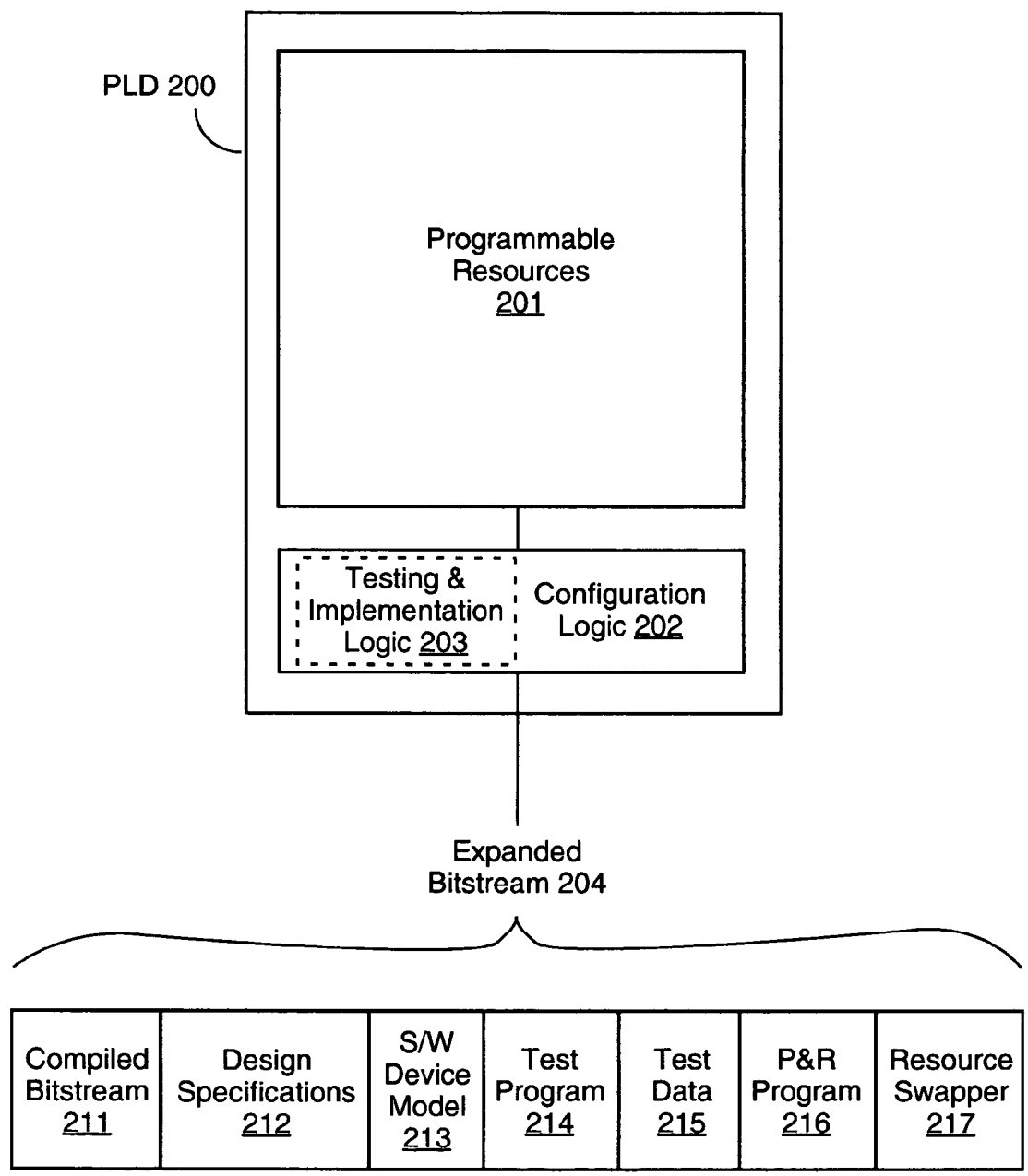
FIG. 2 is a block diagram of a programmable logic device (PLD) that can be programmed to avoid localized defects, and an exemplary expanded bitstream therefor.
Figure 3:
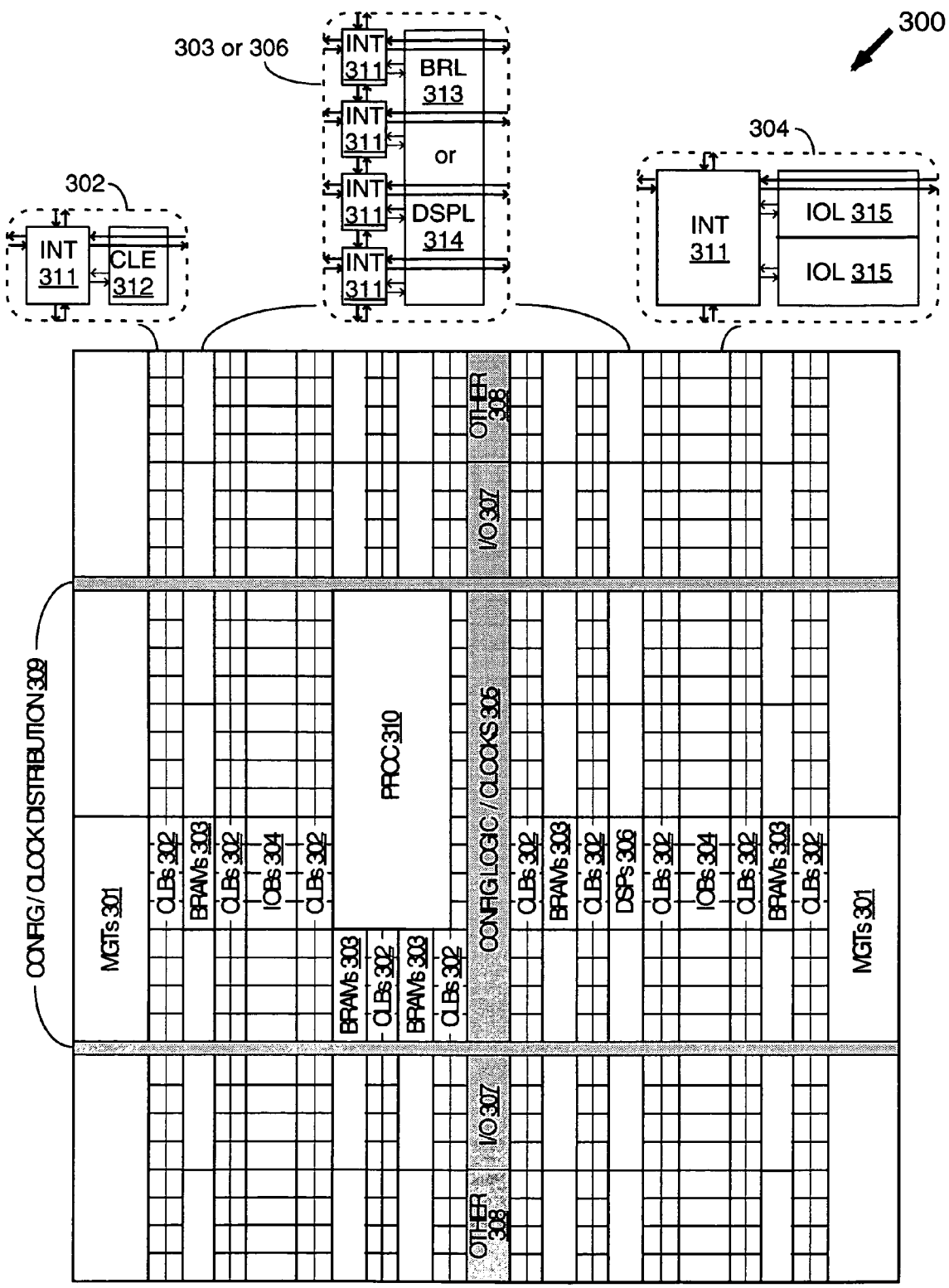
FIG. 3 is a block diagram of another FPGA that can be programmed to avoid localized defects.

As described in the summary section, above, the invention provides methods and structures of programming ICs, e.g., FPGAs and other PLDs including one or more localized defects, while avoiding the localized defects particular to each individual IC. In some embodiments, rather than loading into an IC a fully-compiled bitstream implementing a user design, as in known programming methods, an expanded bitstream is loaded that includes data usable by the IC to implement the user design. By testing each function and connection utilized by the user design, the IC determines which programmable resources are defective due to a localized defect, and implements the design in such a way as to avoid the defective resources. In other embodiments, the expanded bitstream includes a fully compiled bitstream. The IC tests each function and connection used by the compiled bitstream, then modifies the implemented user design to avoid the defective resources. For example, internal signals of the user design can be rerouted to avoid defective interconnect resources, and a fully functional programmable logic resource can be substituted for a similar but defective resource. FIGS. 2 and 3 illustrate exemplary ICs that can be used, for example, to implement these methods.

PLD 200 of FIG. 2 includes a set of programmable resources 201 (e.g., programmable logic blocks and programmable interconnect) and configuration logic 202 for programming the programmable resources 201. PLD 200 can be, for example, an FPGA. PLD 200 can be a partially defective PLD or a fully functional PLD. Configuration logic 202 includes testing and implementation logic 203, which is capable of testing at least portions of the programmable resources 201, and implementing at least part of a user design (defined by an expanded bitstream 204) using the programmable resources.

Configuration logic 202 can include, for example, a microprocessor, a software device model, a test program for testing some or all of the programmable resources in the PLD, test data expected from a fully functional PLD to which the test program is applied, a place and route program for the PLD, and/or a resource swapping program for the PLD. Pending U.S. application Ser. No. 10/104,324, for example, describes exemplary test methods that can be implemented by test programs included in the configuration logic. U.S. application Ser. No. 10/104,324 is hereby incorporated herein by reference in its entirety. The place and route program can be, for example, the same place and route software provided to PLD users by the PLD provider, or can be a simpler program that only repairs existing connections by rerouting one or more internal signals in the user design, or by substituting ("swapping") a fully functional programmable resource for a defective programmable resource.

When included in the configuration logic, these elements can be stored in memory (e.g., ROM) included in the configuration logic, coded as transistor logic on the PLD die, or programmed into the programmable resources of the IC. Additionally or alternatively, some or all of these elements can be provided in the expanded configuration bitstream 204. In some embodiments, the expanded bitstream is read from an off-chip source and then stored on-chip, e.g., using one or more of these methods.

Bitstream 204 is referred to herein as an "expanded bitstream", because it includes not just a compiled bitstream implementing a user design in the IC, but information identifying design requirements for the implementation of the user design. Expanded bitstream 204 can optionally include, for example, a compiled bitstream 211 for a user design (e.g., similar to known configuration bitstreams), design specifications 212 (e.g., a description of logic included in the user design and interconnections among that logic, and/or timing requirements for the user design), a software device model 213 for the PLD, a test program 214 for testing at least a subset of the programmable resources, test data 215 expected from a fully functional PLD, a place and route program 216 for the PLD, and/or a resource swapping program 217 for the PLD.

FIG. 3 illustrates another FPGA 300 that can be programmed to avoid localized defects using an expanded bitstream. This FPGA is well-suited to implementation via an on-chip router, for example, because of the repetitive nature of the interconnect resources. The FPGA architecture of FIG. 3 includes a large number of different programmable tiles including multi-gigabit transceivers (MGTs 301), configurable logic blocks (CLBs 302), random access memory blocks (BRAMs 303), input/output blocks (IOBs 304), configuration logic and clocking logic (CONFIG LOGIC/CLOCKS 305), digital signal processing blocks (DSPs 306), specialized input/output blocks (I/O 307) (e.g., configuration ports and clock ports), and other programmable logic 308 such as digital clock managers, analog-to-digital converters, system monitoring logic, and so forth. Some FPGAs also include dedicated processor blocks (PROC 310).

In some FPGAs, each programmable tile includes a programmable interconnect element (INT 311) having standardized connections to and from a corresponding interconnect element in each adjacent tile. Therefore, the programmable interconnect elements taken together implement the programmable interconnect structure for the illustrated FPGA. The programmable interconnect element (INT 311) also includes the connections to and from the programmable logic element within the same tile, as shown by the examples included at the top of FIG. 3.

For example, a CLB 302 can include a configurable logic element (CLE 312) that can be programmed to implement user logic plus a single programmable interconnect element (INT 311). A BRAM 303 can include a BRAM logic element (BRL 313) in addition to one or more programmable interconnect elements. Typically, the number of interconnect elements included in a tile depends on the height of the tile. In the pictured embodiment, a BRAM tile has the same height as four CLBs, but other numbers (e.g., five) can also be used. A DSP tile 306 can include a DSP logic element (DSPL 314) in addition to an appropriate number of programmable interconnect elements. An IOB 304 can include, for example, two instances of an input/output logic element (IOL 315) in addition to one instance of the programmable interconnect element (INT 311). As will be clear to those of skill in the art, the actual I/O pads connected, for example, to the I/O logic element 315 are manufactured using metal layered above the various illustrated logic blocks, and typically are not confined to the area of the input/output logic element 315.

In the pictured embodiment, a columnar area near the center of the die (shown shaded in FIG. 3) is used for configuration, clock, and other control logic. This area can include, for example, the testing and implementation logic 203 previously described in connection with FIG. 2. Horizontal areas 309 extending from this column are used to distribute the clocks and configuration signals across the breadth of the FPGA.

Some FPGAs utilizing the architecture illustrated in FIG. 3 include additional logic blocks that disrupt the regular columnar structure making up a large part of the FPGA. The additional logic blocks can be programmable blocks and/or dedicated logic. For example, the processor block PROC 310 shown in FIG. 3 spans several columns of CLBs and BRAMs.

In some embodiments, a portion of the programmable logic (e.g., including CLBs, IOBs, BRAMs, PROC, interconnect, and/or other user-programmable logic) of FIG. 3 is pre-tested and is then used to implement the configuration logic that performs the methods of the present invention. In these embodiments, no additional circuitry is required on the PLD or in an external configuration control device to implement the invention. However, the PLD includes the ability to reprogram itself as it continues to operate. The ability to self-reprogram is a feature now available in advanced FPGAs such as the Virtex™-II series FPGAs from Xilinx, Inc. Because the programmable resources used by the configuration logic must function correctly if this method is to be practiced by the PLD end-user, fewer total defects can be avoided. However, there is no need to test the programmable resources used for the configuration logic during execution of the inventive methods, because this logic is already known to be correct.

Note that FIG. 3 is intended to illustrate only an exemplary FPGA architecture. For example, the numbers of logic blocks in a column, the relative width of the columns, the number and order of columns, the types of logic blocks included in the columns, the relative sizes of the logic blocks, and the interconnect/logic implementations included at the top of FIG. 3 are purely exemplary. For example, in an actual FPGA more than one adjacent column of CLBs is typically included wherever the CLBs appear, to facilitate the efficient implementation of user logic, but the number of adjacent CLB columns varies with the overall size of the FPGA.

Figure 4:
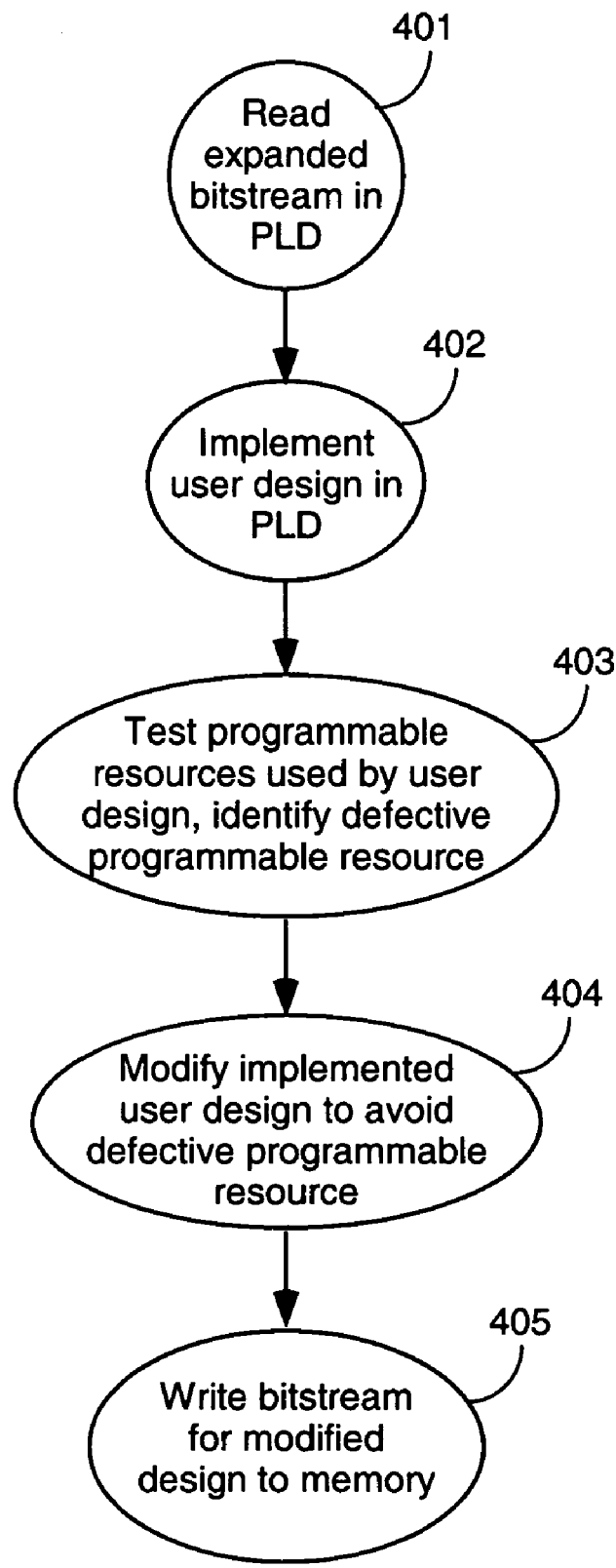
FIG. 4 illustrates the steps of a first method of programming a PLD while avoiding localized defect(s) in the PLD.

FIG. 4 illustrates the steps of a first method of programming a PLD while avoiding one or more localized defects in the PLD. The PLD can be, for example, a partially defective FPGA. In step 401, an expanded bitstream is read into the PLD. The expanded bitstream includes design specifications for a user design, e.g., a description of logic included in the user design and interconnections among the logic included in the user design, and/or timing requirements for the user design. The expanded bitstream can also include other information, such as a software device model for the PLD, a test program for testing some or all of the programmable resources in the PLD, test data expected from a fully functional PLD, a place and route program for the PLD, and/or a resource swapping program for the PLD. Note that the "expanded bitstream" in this embodiment need not include an actual pre-compiled "configuration bitstream" targeted to the PLD, if the user design is otherwise fully specified.

The specifications for an extensive or complicated user design can be large, but need not be so large as to render the present invention impractical. For example, for an FPGA including about 10,000 configurable logic blocks (CLBs) and having eight nets per CLB, and assuming an average fan-out of 2.5 destinations, the straightforward approach is to specify eight sources and 20 destinations for each of the 10,000 CLBs. The identification of the CLB and the CLB pin are also specified, which for a 10,000 CLB FPGA with 64 pins per CLB requires a 16-bit CLB address and a 6-bit pin address. Therefore, the specification of 28 pins per CLB consumes 28*(16+6)=616 bits. Timing information, if included, may add additional bits. However, many innovative dense timing specification formats are possible, as described below. A modern CLB requires thousands of configuration bits. Therefore, the specification of the netlist used in this embodiment is only about 10 percent of the size of a compiled bitstream. In addition to specifying CLBs, other logic blocks (e.g., IOBs, BRAM, MGTs, etc.) can also be specified without unduly increasing the size of the expanded bitstream.

In some embodiments, the user design specification is less fully encoded. For example, a user design specification can refer to a frame address and offset for each pin of a logic block, to simplify finding the test points. In this example, each pin requires a somewhat higher number of bits to specify the location.

In some embodiments, data compression techniques are used to reduce the size of the expanded bitstream.

As noted above, timing requirements can also be specified in such as way as to reduce the size of the expanded bitstream. The straightforward method of specifying timing is to simply annotate each connection with a delay number, and this method can be used. However, in an FPGA, for example, most nets are routed to adjacent CLBs. There are only a small number of possible delay values for these connections, so rather than store the actual delay number, the delay number can be encoded into a small integer. Another method is to set a delay value, and then list all nets or connections that require that delay value. Limiting the number of possible required delays can also reduce the size of the expanded bitstream.

In step 402, the user design is implemented in the PLD using some or all of the programmable resources in the PLD. The implementation is performed based on data from the expanded bitstream loaded in step 401. Implementation step 402 can include, for example, placing and routing the user design using a place and route program that is included in the expanded bitstream, programmed into the programmable resources of the PLD during a previous programming step, stored in non-volatile memory included in the PLD, or coded as transistor logic on the PLD die. One simple algorithm that can be used to place and route the user design within the PLD includes ordering the logic specifications in the expanded bitstream in such a way as to correspond to the desired placement within the PLD. For example, logic specifications can be ordered so that the preferred placement is row-by-row, and the routing can be performed by an on-chip router.

In step 403, the programmable resources used by the implemented user design are tested to identify a defective programmable resource included in the PLD. In some embodiments, only those resources used by the implemented user design are tested. In some embodiments, all programmable resources in the PLD are tested. In some embodiments, all programmable resources not already tested as part of the manufacturing process are tested in step 403. For example, all clock nets could be pre-tested and the clock nets would therefore not need to be tested in this step of the process. In some embodiments, all lookup tables are pre-tested. In some embodiments, only the programmable resources most susceptible to failure in the field are tested. In other embodiments, other methods are used to determine which programmable resources are tested in step 403. In some embodiments where the choice of programmable resources to be tested is independent of the user design implementation, step 403 can be performed prior to step 402, or even prior to step 401.

The test program can test, for example, interconnect, logic, and memory in the PLD. Pending U.S. application Ser. No. 10/104,324, for example, describes exemplary test programs that can be used with the methods of the present invention. Testing memory is a straightforward write and read-back procedure. Lookup tables (LUTs) are also easily tested using similar methods, because LUTs are also memories. Testing connections typically involves setting the source value for a connection and observing the signal at its destination. For example, a test algorithm can set the source to produce a low value, check that the low value was received at the destination, and repeat for a high value. In one embodiment of the present invention, an on-chip processor (e.g., configuration logic 202/305) maps from a CLB address and pin number (the source) to a test point (the destination). The source can be, for example, a LUT or a flip-flop output. The processor can change the settings of the LUT and flip-flop at pin sources. Similarly, the processor can also route the destination value into a flip-flop or capture point.

A tradeoff can be made between test complexity and test data size. Existing tests can be pre-compiled and merely loaded and checked by a relatively simple program in the configuration logic (e.g., the on-chip processor). However, this approach requires a large amount of test data. Alternatively or additionally, the configuration logic can be programmed to carry out a test generation algorithm, generating and carrying out the tests on-the-fly. This approach is more complex, but significantly reduces the amount of pre-computed test data that must be supplied. This latter solution derives an advantage from running in the on-chip configuration logic, because the test configuration can be directly applied to the PLD programming instead of building a bitstream and loading it into the PLD for each test.

In some embodiments, test points are inserted in the configuration fabric of the PLD so the configuration logic can directly write and read each test point through the bitstream.

In some embodiments, the test algorithm measures timing by sampling the destination values very quickly. If the signal path is too fast for the configuration logic to detect the precise timing of the test signals, the configuration logic can build an oscillator or counter in the destination logic element to measure the timing of the signal.

The test program(s) can be, for example, included in the expanded bitstream, programmed into the programmable resources of the PLD during a previous programming step, stored in non-volatile memory included in the PLD, or coded as transistor logic on the PLD die. The test information can include more than one test program plus information specifying which test(s) are to be performed.

If the test fails, an error code is generated that identifies the defective programmable resource.

In step 404, the implemented user design from step 402 is modified to avoid the defective programmable resource identified in step 403. The design can be modified, for example, by rerouting at least one internal signal in the user design, and (optionally) by substituting a fully functional programmable resource for the defective programmable resource. More complex repair algorithms take longer to execute and more resources to implement, but provide better end-user yield and quality of result.

Rerouting an internal signal can be done, for example, using the well-known maze routing technique. In a maze router, a model of the network is built, and used resources in the model are identified. Defective resources are marked as used. The maze router walks the model of the network from the source until it reaches the destination. The shortest path uses the fewest resources and is usually the fastest path as well. A maze router can be implemented in the configuration logic of the PLD. To perform a maze route, all used resources should be known, and this information can be derived from an inspection of the used bits in the bitstream. In some embodiments, only a portion of the route graph of the network is implemented. This approach can be successful because most signals route within a limited area, and those that do not do so are unlikely to meet the timing requirements for that signal. In some embodiments, the route graph for the network is translated into hardware and the programmable logic in other portions of the PLD is used to perform the rerouting. In a regular PLD array, the route graph is highly regular and its representation is compact. In some embodiments, an external memory is provided for storage of the repair algorithm's wavefront expansion data.

In some embodiments, pre-computed alternate path information and/or substitute resource information is provided. In other words, because of the repetitive nature of the PLD array, many or most of the nets and/or functions can have pre-computed alternatives. When a signal path is rerouted due to the presence of a defective programmable resource, the signal path is simply replaced by the alternative path. A defective lookup table (LUT) can be overcome by moving the LUT logic to an unused LUT location and rerouting the nets to and from the LUT. In some embodiments, a function that uses only a portion of a defective LUT is re-implemented using only the fully functional portion of the LUT. For example, a defective LUT that implements a 3-input function in a 4-input LUT can sometimes be overcome by simply shifting the function into the fully functional bits of the LUT and reassigning one input pin.

In one embodiment that utilizes such a "resource swapping" program, an alternative programmable resource is pre-computed at compile time using the following algorithm:

1) Perform synthesis, placement, and routing

2) For each net:
   Mark its features as unusable
   Rip up and reroute the net
   Identify changed bits or changed region of bitstream
   Make a list of the corrections for each net:
   change_list_array[#nets] {
      int bitstream_start_point;
      int number_of_flipped_bits;
      int flipped_bit_offset[#number_of flipped_bits];
   }

3) For each logic function:
   Find an alternate location for the logic function
   Reroute all nets that connect to the logic function
   Identify changed bits or changed region of the bitstream
   Make list of corrections for each net:
   change_list_array[#functions] {
      int bitstream_start_point;
      int number_of_flipped_bits;
      int flipped_bit_offset[#number_of_flipped_bits];
   }

At configuration time, the following series of steps is performed:

1) For each net:
   Test the net
   If test failed, flip all bits in change_list_array for that net 2) For each function:
   Test the function
   If test failed, flip all bits in change_list_array for that function.

In some embodiments, steps 401-404 occur as separate processes performed in the order shown in FIG. 4. In some embodiments, one or more of these steps are performed as a single interactive process. For example, a first portion of the expanded bitstream can be read and implemented prior to or during the reading of a second portion of the expanded bitstream. If the programmable resources have already been tested and defective resources have been identified, the implemented design can be tested as part of the implementation process to see whether any defective resources are used, and the design can be modified during the implementation process to avoid the defective resources. In other embodiments, the steps illustrated in FIG. 4 are combined into interactive processes in other ways.

In optional step 405, a compiled bitstream representing the modified implemented user design is written to memory. In some embodiments, the bitstream is written to a memory device external to the PLD (e.g., a PROM). This step can be accomplished, for example, using a standard readback procedure supported by many FPGAs. By storing the modified user design in an external PROM that is kept associated with the partially defective PLD, the potentially lengthy procedure shown in FIG. 4 can be avoided in future reconfigurations of the PLD. In some embodiments, the bitstream is written to a non-volatile memory included in the PLD itself, where it can be used at a later time for the same purpose.

In one embodiment, the method illustrated in FIG. 4 is directed to a known PLD that includes a relatively small amount of programmable interconnect and programmable logic, with the majority of the PLD being dedicated to fixed logic. In this embodiment, the amount of memory needed to store the bitstream for the modified user design is small relative to the overall size of the PLD. Therefore, storing the bitstream in an on-chip non-volatile memory might be more practical in this embodiment than in some embodiments where the PLD includes relatively larger numbers of programmable elements.

One or more of steps 401-405 can be performed, for example, by configuration logic 202 of FIG. 2 or 305 of FIG. 3.

Figure 5:
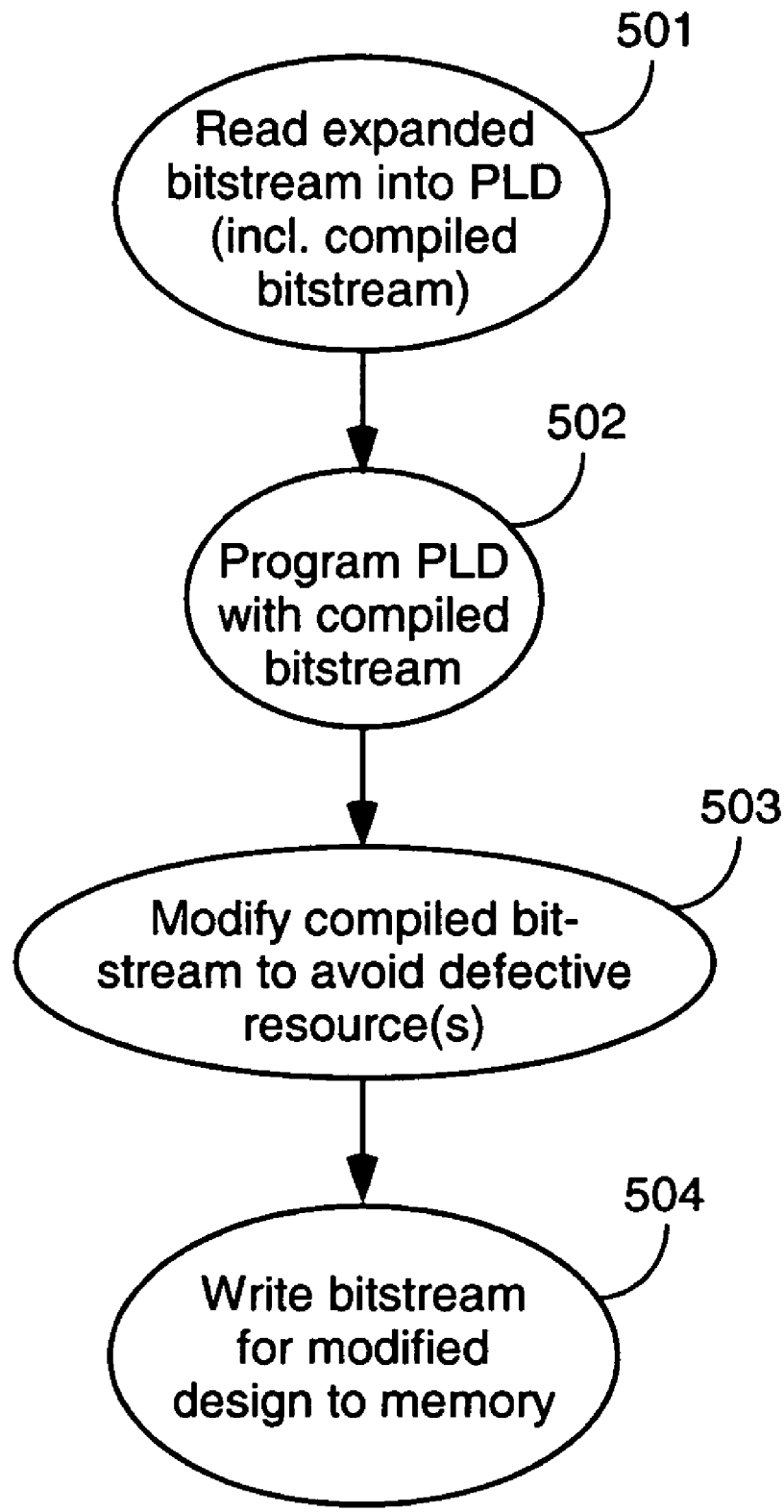
FIG. 5 illustrates the steps of a second method of programming a PLD while avoiding localized defect(s) in the PLD.

FIG. 5 illustrates the steps of a second method of programming a PLD while avoiding one or more localized defects in the PLD. The PLD can be, for example, a partially defective FPGA. In step 501, an expanded bitstream is read into the PLD. In this method, the expanded bitstream includes a previously compiled bitstream for the user design in the PLD, and the compiled bitstream utilizes at least one defective programmable resource in the PLD.

The expanded bitstream can also include other information, such as test data expected from a fully functional PLD, data identifying a source and a destination for at least one internal net included in the user design, a timing requirement for at least one internal signal included in the user design, functional specifications for the user design, and so forth. Specifications can take any of the forms described above in connection with FIG. 4, for example. In some embodiments, a timing specification (e.g., the timing specification used in implementing the original design) is included in the expanded bitstream. In some embodiments, the timing requirements for rerouting an internal net are determined by the timing of the same net in the compiled bitstream. In other words, the rerouted net must have no greater delay than the same net in the original compiled bitstream. Therefore, timing requirements need not be included in the expanded bitstream. Modifications of the design (see step 503, below) are simply limited to alterations that lead to shorter delays than those of the same nets in the originally compiled design.

In step 502, the compiled bitstream is programmed into the PLD. In some embodiments, step 502 is performed concurrently with step 501. In step 503, the compiled bitstream is modified within the programmed PLD to create a modified bitstream that does not utilize the defective programmable resource. In some embodiments, step 503 includes testing the programmable resources used by the compiled bitstream to identify the defective programmable resource, and then rerouting at least one internal signal in the user design to avoid the defective programmable resource, and (optionally) substituting a fully functional programmable resource for the defective programmable resource. Testing and modifying methods similar to those described above in connection with FIG. 4 can optionally be used.

In some embodiments, steps 501-503 occur as separate processes performed in the order shown in FIG. 5. In some embodiments, one or more of these steps are performed as a single interactive process. For example, a second portion of the expanded bitstream (e.g., a second portion of the compiled bitstream) can be read and programmed into the PLD (steps 501 and 502) while a previous portion is being tested and modified (step 503). In other embodiments, the steps illustrated in FIG. 5 are combined into interactive processes in other ways.

In step 504, the modified bitstream from step 503 is written to memory. In some embodiments, the bitstream is written to a memory device external to the PLD (e.g., a PROM). This step can be accomplished, for example, using a standard readback procedure supported by many FPGAs. By storing the modified bitstream in an external PROM that is kept associated with the partially defective PLD, the potentially lengthy procedure shown in FIG. 5 can be avoided in future reconfigurations of the PLD. In some embodiments, the bitstream is written to a non-volatile memory included in the PLD itself, where it can be used at a later time for the same purpose.

In one embodiment, the method illustrated in FIG. 5 is directed to a known PLD that includes a relatively small amount of programmable interconnect and programmable logic, with the majority of the PLD being dedicated to fixed logic. In this embodiment, the amount of memory needed to store the bitstream for the modified user design is small relative to the overall size of the PLD. Therefore, storing the bitstream in an on-chip non-volatile memory might be more practical in this embodiment than in some embodiments where the PLD includes relatively larger numbers of programmable elements.

One or more of steps 501-504 can be performed, for example, by configuration logic 202 of FIG. 2 or 305 of FIG. 3.

Clearly, it might not be possible to overcome all defective programmable resources using the methods described herein. For example, where there are many localized defects, or where the user design utilizes a large percentage of the available programmable resources, the methods of the invention might not result in a fully functional user design in the partially defective PLD. The chances of success can be increased, for example, by discarding PLDs having failures in critical areas (e.g., power and/or ground shorts, clock distribution failures) or a large number of defects. Another method of improving the chances of success involves deliberately leaving unused resources (e.g., spare interconnect or logic) when doing the initial implementation of the design (e.g., during placement and routing). The success of the process can be significantly improved by generating trial alternate routes at compile time for each net and/or function, as described above in connection with FIG. 4. Optionally, the alternate routes and/or the pattern of required correctable bits can be stored and provided in a memory device along with a PLD that includes localized defects. Clearly, this approach will reduce the size of the user design that can be accommodated by the PLD.

Those having skill in the relevant arts of the invention will now perceive various modifications and additions that can be made as a result of the disclosure herein. For example, the above text describes the methods and structures of the invention in the context of programmable logic devices (PLDs) such as field programmable gate arrays (FPGAs). However, the methods and structures of the invention can also be implemented utilizing other types of PLDs, e.g., CPLDs, PLAs, PALs, and so forth. The methods and structures of the invention can also apply to any integrated circuit (IC) that includes programmable resources, e.g., programmable interconnect devices such as communications ICs, switch fabric ICs, crossbar switch ICs, and so forth. Other ICs to which the invention can be applied include, for example, multiprocessor devices with a programmable switch fabric and ASIC devices or other ICs incorporating FPGA logic.

Accordingly, all such modifications and additions are deemed to be within the scope of the invention, which is to be limited only by the appended claims and their equivalents.

What is claimed is:

1. A method of programming an integrated circuit (IC) comprising a plurality of programmable resources, the method comprising:
    reading an expanded bitstream into the IC, the expanded bitstream comprising design specifications for a user design and further comprising a test program for testing at least a subset of the programmable resources;
    implementing the user design in the IC using at least a subset of the programmable resources and based on data from the expanded bitstream;
    testing those of the programmable resources used by the implemented user design to identify a defective programmable resource included in the IC; and
    modifying the implemented user design to avoid the defective programmable resource.

2. The method of claim 1, wherein the reading, implementing, testing, and modifying occur in the order described in claim 1.

3. The method of claim 1, wherein the reading, implementing, testing, and modifying together comprise an interactive process.

4. The method of claim 1, further comprising:
    writing to an external memory device a compiled bitstream representing the modified implemented user design.

5. The method of claim 1, further comprising:
writing to a non-volatile memory included in the IC a compiled bitstream representing the modified implemented user design.

6. The method of claim 1, wherein modifying the implemented user design comprises rerouting at least one internal signal in the user design.

7. The method of claim 1, wherein modifying the implemented user design comprises substituting a fully functional programmable resource for the defective programmable resource.

8. The method of claim 1, wherein the design specifications comprise a description of logic included in the user design and interconnections among the logic included in the user design.

9. The method of claim 1, wherein the design specifications comprise timing requirements for the user design.

10. The method of claim 1, wherein the expanded bitstream further comprises test data expected from a fully functional IC.

11. The method of claim 1, wherein the expanded bitstream further comprises a place and route program for the IC, and modifying the implemented user design to avoid the defective programmable resource comprises utilizing the place and route program to reroute at least one internal signal in the user design.

12. The method of claim 1, wherein the expanded bitstream further comprises a resource swapping program for the IC, and modifying the implemented user design to avoid the defective programmable resource comprises utilizing the resource swapping program to substitute a fully functional programmable resource for the defective programmable resource.

13. The method of claim 1, wherein the IC comprises a programmable logic device (PLD).

14. The method of claim 13, wherein the PLD comprises a field programmable gate array (FPGA).

15. The method of claim 1, wherein the testing is controlled by circuits located within the IC.

16. The method of claim 1, wherein the modifying is performed by circuits located within the IC.

17. An integrated circuit (IC), comprising:
a plurality of programmable resources;
means for reading an expanded bitstream into the IC, the expanded bitstream comprising design specifications for a user design and further comprising a test program for testing at least a subset of the programmable resources;
means for implementing the user design in the IC using at least a subset of the programmable resources and based on data from the expanded bitstream;
means for testing those of the programmable resources used by the implemented user design to identify a defective programmable resource included in the IC; and
means for modifying the implemented user design to avoid the defective programmable resource.

18. The IC of claim 17, wherein the IC comprises a programmable logic device (PLD).

19. The IC of claim 18, wherein the PLD comprises a field programmable gate array (FPGA).

20. A method of programming an integrated circuit (IC) with a user design, the IC comprising a plurality of programmable resources, at least one of the programmable resources being a defective programmable resource as a result of a localized defect in the IC, the method comprising:

reading an expanded bitstream into the IC, the expanded bitstream comprising a compiled bitstream for the user design in the IC, the compiled bitstream utilizing the defective programmable resource, the expanded bitstream further comprising test data expected from a fully functional IC programmed with the compiled bitstream;
programming the IC with the compiled bitstream;
modifying the compiled bitstream within the programmed IC to create a modified bitstream that does not utilize the defective programmable resource; and
writing the modified bitstream to an external memory device.

21. The method of claim 20, wherein the reading, programming, and modifying occur in the order described in claim 17.

22. The method of claim 20, wherein the reading, programming, and modifying together comprise an interactive process.

23. The method of claim 20, wherein modifying the compiled bitstream within the programmed IC comprises testing those of the programmable resources used by the compiled bitstream to identify the defective programmable resource.

24. The method of claim 20, wherein modifying the compiled bitstream within the programmed IC comprises rerouting at least one internal signal in the user design.

25. The method of claim 20, wherein modifying the compiled bitstream within the programmed IC comprises substituting a fully functional programmable resource for the defective programmable resource.

26. The method of claim 20, wherein the expanded bitstream further comprises data identifying a source and a destination for at least one internal net included in the user design.

27. The method of claim 20, wherein the expanded bitstream further comprises a timing requirement for at least one internal signal included in the user design.

28. The method of claim 20, wherein the expanded bitstream further comprises functional specifications for the user design.

29. The method of claim 20, wherein the IC comprises a programmable logic device (PLD).

30. The method of claim 29, wherein the PLD comprises a field programmable gate array (FPGA).

31. The method of claim 20, wherein the modifying is performed by circuits located within the IC.

32. The method of claim 20, wherein the writing is performed by circuits located within the IC.

33. An integrated circuit (IC), comprising:
a plurality of programmable resources, at least one of the programmable resources being a defective programmable resource as a result of a localized defect in the IC;
means for reading an expanded bitstream into the IC, the expanded bitstream comprising a compiled bitstream for a user design in the IC, the compiled bitstream utilizing the defective programmable resource, the expanded bitstream further comprising test data expected from a fully functional IC programmed with the compiled bitstream;
means for programming the programmable resources with the compiled bitstream;
means for modifying the compiled bitstream stored in the programmable resources to create a modified bitstream that does not utilize the defective programmable resource; and means for writing the modified bitstream to an external memory device.

34. The IC of claim 33, wherein the IC comprises a programmable logic device (PLD).

35. The IC of claim 34, wherein the PLD comprises a field programmable gate array (FPGA).

36. A method of programming an integrated circuit (IC) comprising a plurality of programmable resources, the method comprising:

reading an expanded bitstream into the IC, the expanded bitstream comprising design specifications for a user design and further comprising a software device model for the IC;

implementing the user design in the IC using at least a subset of the programmable resources and based on data from the expanded bitstream;

testing those of the programmable resources used by the implemented user design to identify a defective programmable resource included in the IC; and modifying the implemented user design to avoid the defective programmable resource.

37. The method of claim 36, wherein the reading, implementing, testing, and modifying occur in the order described in claim 1.

38. The method of claim 36, wherein the reading, implementing, testing, and modifying together comprise an interactive process.

39. The method of claim 36, further comprising:
writing to an external memory device a compiled bitstream representing the modified implemented user design.

40. The method of claim 36, further comprising:
writing to a non-volatile memory included in the IC a compiled bitstream representing the modified implemented user design.

41. The method of claim 36, wherein modifying the implemented user design comprises rerouting at least one internal signal in the user design.

42. The method of claim 36, wherein modifying the implemented user design comprises substituting a fully functional programmable resource for the defective programmable resource.

43. The method of claim 36, wherein the design specifications comprise a description of logic included in the user design and interconnections among the logic included in the user design.

44. The method of claim 36, wherein the design specifications comprise timing requirements for the user design.

45. The method of claim 36, wherein the expanded bitstream further comprises test data expected from a fully functional IC.

46. The method of claim 36, wherein the expanded bitstream further comprises a place and route program for the IC, and modifying the implemented user design to avoid the defective programmable resource comprises utilizing the place and route program to reroute at least one internal signal in the user design.

47. The method of claim 36, wherein the expanded bitstream further comprises a resource swapping program for the IC, and modifying the implemented user design to avoid the defective programmable resource comprises utilizing the resource swapping program to substitute a fully functional programmable resource for the defective programmable resource.

48. The method of claim 36, wherein the IC comprises a programmable logic device (PLD).

49. The method of claim 48, wherein the PLD comprises a field programmable gate array (FPGA).

50. The method of claim 36, wherein the testing is controlled by circuits located within the IC.

51. The method of claim 36, wherein the modifying is performed by circuits located within the IC.

52. An integrated circuit (IC), comprising:

a plurality of programmable resources;

means for reading an expanded bitstream into the IC, the expanded bitstream comprising design specifications for a user design and further comprising a software device model for the IC;

means for implementing the user design in the IC using at least a subset of the programmable resources and based on data from the expanded bitstream;

means for testing those of the programmable resources used by the implemented user design to identify a defective programmable resource included in the IC; and means for modifying the implemented user design to avoid the defective programmable resource.

53. The IC of claim 52, wherein the IC comprises a programmable logic device (PLD).

54. The IC of claim 53, wherein the PLD comprises a field programmable gate array (FPGA).

* * * * *